United States Patent [19]
Alfaro

[11] Patent Number: 5,186,378
[45] Date of Patent: Feb. 16, 1993

[54] METHOD AND APPARATUS FOR TRANSDUCER HEATING IN LOW TEMPERATURE BONDING

[75] Inventor: Rafael C. Alfaro, The Colony, Tex.

[73] Assignee: Texas Instruments Incorporated, Dallas, Tex.

[21] Appl. No.: 767,741

[22] Filed: Sep. 30, 1991

[51] Int. Cl.$^5$ ............... B23K 20/10; H01L 21/607
[52] U.S. Cl. ............................. 228/110; 228/179; 228/1.1; 228/4.5; 156/580.1
[58] Field of Search ............... 228/110, 111, 179, 1.1, 228/4.5

[56] References Cited

U.S. PATENT DOCUMENTS

| | | |
|---|---|---|
| 3,054,309 | 9/1962 | Elmore et al. |
| 3,747,198 | 7/1973 | Benson et al. ............ 29/471.1 |
| 4,315,128 | 2/1982 | Matcovich ............ 228/4.5 |
| 4,529,115 | 7/1985 | Renshaw et al. ............ 228/1.1 |
| 4,534,811 | 8/1985 | Ainslie et al. ............ 228/1.1 |
| 4,821,944 | 4/1989 | Tsumara ............ 228/1.1 |
| 4,854,494 | 8/1989 | von Raben ............ 228/102 |
| 5,002,217 | 3/1991 | Tani et al. ............ 228/1.1 |

OTHER PUBLICATIONS

Texas Instruments Process Automation Center Brochure for ABACUS IIISE Wire Bonder Copyright 1991.

Primary Examiner—Samuel M. Heinrich
Attorney, Agent, or Firm—W. James Brady, III; B. Peter Barndt; Richard L. Donaldson

[57] ABSTRACT

An apparatus (10) and method is provided for bonding wire (12) to the bond sites (28) of integrated circuits. In preferred embodiments gold wire (12) is bonded to aluminum bond pad (28). Apparatus (10) includes a high frequency ultrasonic energy source (20) designed to provide ultrasonic energy at frequencies above about 100 kHz causing the interface temperature required for adequate bonding to be greatly reduced. Heating element (19) applies thermal energy to interface (32) via capillary (16) and transducer (18). Therefore, according to the invention, less thermal energy is required from heater block (22) which is heating interface (32) via IC (14) and leadframe (15). In this fashion, leadframe (15) is maintained at a lesser temperature than in the prior art. Since leadframe (15) is at a lesser temperature, it can be plated with a material having a lower melting point (e.g. tin or solder). In preferred embodiments, leadframe (15) is substantially plated with tin (melting point 185° C.) and maintained at about 165° C. Interface (32) is maintained at about 180° C. by thermal energy from heating element (19) (during the bonding process). In preferred embodiments capillary (16) is substantially made of beryllium oxide for adequate thermal conductivity.

20 Claims, 1 Drawing Sheet

METHOD AND APPARATUS FOR TRANSDUCER HEATING IN LOW TEMPERATURE BONDING

CROSS-REFERENCE TO RELATED APPLICATIONS

The following coassigned patent applications are hereby incorporated herein by reference:
TI-15067, filing date Sep. 30, 1991; Ser. No. 07/767,740
TI-15645, filing date Sep. 30, 1991; Ser. No. 07/767,731
TI-14570, filing date Sep. 30, 1991; Ser. No. 07/768,501

BACKGROUND OF THE INVENTION

1. Field of the Invention

This invention relates to integrated circuit (IC) interconnections. More particularly, it relates to IC interconnections utilizing a heated ultrasonic transducer.

2. Description of the Prior Art

Conventional bonding temperatures for IC interconnections typically range between 250° C. to 380° C. This temperature range limits the kind of plating materials which can be used in the fabrication of leadframes. Use of lower-melting point materials such as tin or solder would not only reduce the cost of raw materials for plating but would also give generally greater flexibility in the processing of the integrated circuit (i.e. if temperatures of 250° C. to 380° C. did not have to be obtained for IC bonding).

Thus the existing process temperature for IC bonding, limits the use of materials other than those generally used now such as silver, nickel, copper, alloy 42, etc.

Conventional processes such as thermosonic or thermocompression methods achieve the high temperatures needed for IC interconnection substantially by heating the integrated circuit and the leadframe with a heater block which provides the heat necessary to get good ball bonds and stitch bonds. Thus, the temperature of the IC chip and the leadframe are essentially at the same temperature as required for the IC interconnection bonding because the chip and leadframe are mounted on the heater block surface.

What is needed is a process wherein the leadframe and IC chip can be maintained at a lower temperature so that more economical materials can be used. Another desirable aspect of lowering the temperature would be to achieve greater processing flexibility, as mentioned above.

SUMMARY OF THE INVENTION

The problems outlined above are in large measure solved by the method and apparatus in accordance with the present invention. That is to say the invention hereof provides a bonding process conducted at a lower temperature wherein the chip and leadframe are advantageously maintained at a temperature less than that of the prior art. An IC mounted on a leadframe is heated at a temperature below the melting point of the plating materials of the leadframe (e.g. tin or solder) while additional heat is provided to the bonding interface between the bond site and the wire via an ultrasonic transducer which is thermally heated to provide additional thermal energy at the interface.

In preferred embodiments, tin is used in the leadframe which is kept on a heater block and heated to a temperature of about 165° C. while additional thermal energy is provided via the heated ultrasonic transducer to achieve a bonding interface temperature of about 180° C. In this fashion, the tin plating of the leadframe is maintained below the melting point while higher temperatures are achieved for the bonding process at the interface.

The importance of utilizing high frequency ultrasonic energy (i.e. above about 100 kHz) with a heated transducer is that it allows optimum bonding to any IC pad metallization and to any leadframe type (alloy 42, tin or solder plated, Pd. plated, etc.). The additional heat from the transducer provides the conditions for the wire and the leadframe to be interconnected.

Generally speaking, the invention provides a method of forming a microelectronic bond, the method comprising the steps of:
 (a) providing a conductive bond site;
 (b) contacting a wire having a bonding end;
 (c) contacting the bonding end of the wire to the bond site, the bonding end and the bond site presenting an interface therebetween;
 (d) providing a thermally conductive ultrasonic transducer; and
 (e) heating the transducer so that thermal energy is applied at the interface.

DESCRIPTION OF THE PREFERRED EMBODIMENT

Figure 1:
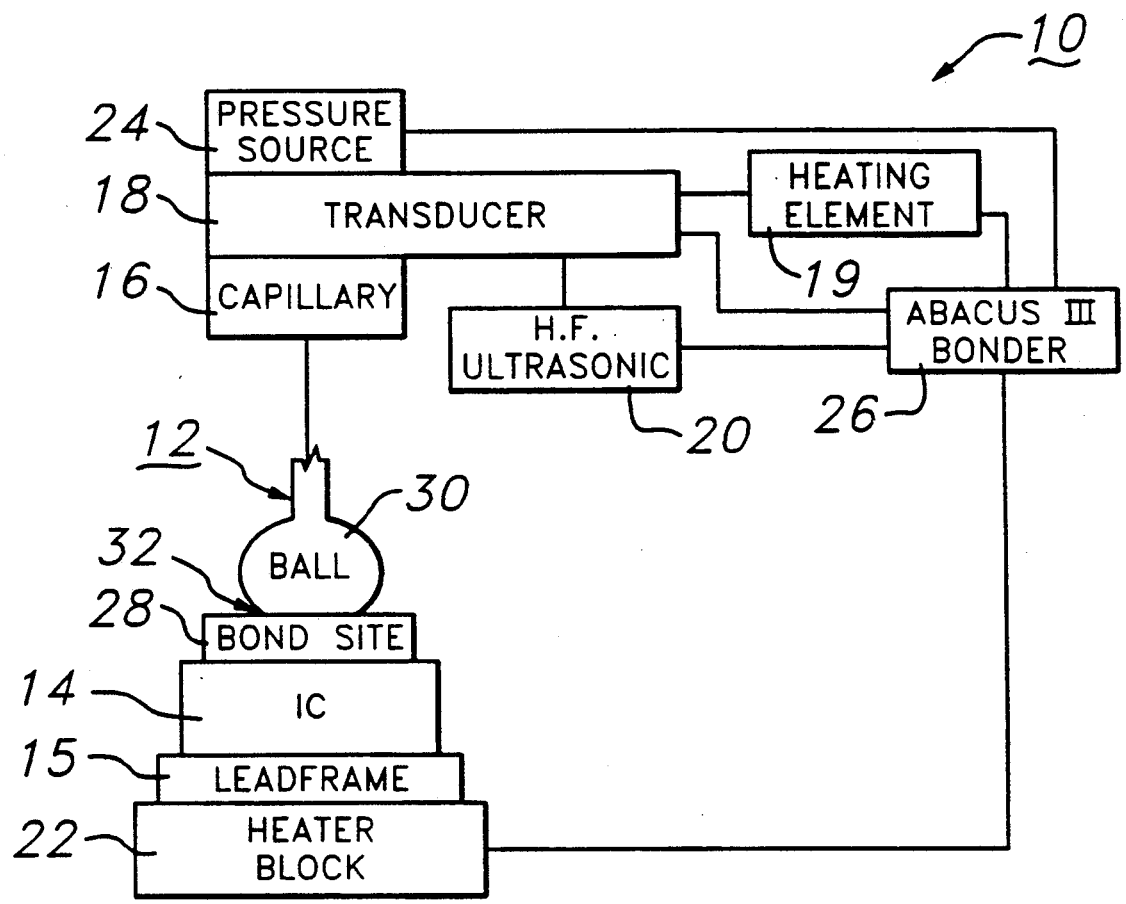
FIG. 1 is partially a block diagram, partially a schematic representation of a bonding apparatus used for bonding wire to a microelectronic integrated circuit in accordance with the invention.

Referring now to the drawing in general and FIG. 1 in particular, a bonding apparatus 10 is depicted in block diagram with a wire 12 and a microelectronic integrated circuit 14 mounted on a leadframe 15. Bonding apparatus 10, according to the invention, utilizes a low temperature (preferably about 180° C.) thermosonic process to create ball bonds and stitch bonds. Apparatus 10 includes a bonding tool or capillary 16, a transducer 18, a heating element 19, a high frequency ultrasonic energy source 20, a heater block 22, a pressure source 24, and the remainder of apparatus 10 is represented by the box at reference numeral 26.

IC 14 is conventional in nature and could be, for example, a 16 megabit DRAM (dynamic random access memory) such as manufactured by Texas Instruments, Incorporated of Dallas, Texas. IC 14 substantially includes manufacturing grade monocrystalline silicon for the substrate but other materials could also be used. For example, but not by way of limitation, gallium arsenide or germanium could be used for the substrate of IC 14. Other types of memory ICs are within the scope of the present invention, such as static random access memories. Indeed, logic dies or linear semiconductors such as power devices could also be the subject of the present process. Additionally IC 14 need not be a VLSI chip but could also be an MSI or SSI chip, and indeed could be a discrete or hybridized component.

IC 14 includes a bond site 28. In preferred embodiments bond site 28 is a bond pad substantially made of aluminum alloy (2% copper). Other aluminum alloys such as 1% silicon, 0.5% copper could be utilized and indeed other metals or alloys could be used for bond site 28, either separately or in conjunction with aluminum.

Wire 12 is pure gold in the preferred embodiment, but alternatively, wire 12 could be made of a gold alloy, or wires made of other metals or alloys could also be used. Wire end 12 includes bond end 30 which is a ball as depicted but will alternatively be a portion to be stitched when stitch bonding is being performed at leadframe 15.

Capillary 16 acts as a conduit for wire 12 and imparts ultrasonic energy and pressure at the interface 32 during the bonding process, as is well known in the art. Capillary 16 is conventional in nature and is made of a beryllium oxide in the preferred embodiment.

Figure 2:
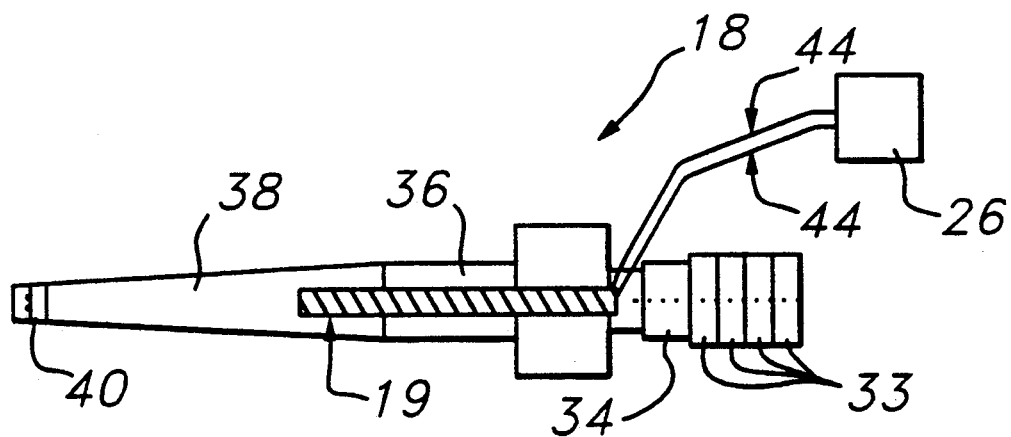
FIG. 2 is sectional elevational view of an ultrasonic transducer electrically coupled to a heating element.

Referring to FIG. 2, metallic transducer (or horn) 18 is about ten centimeters in length and includes four piezoelectric crystals 33 on tail end 34. Horn 18 also includes a body portion 36 and a tapered front end 38 having a tool clamp point 40 where capillary 16 is mounted. Horn 18 is modified in length, and the number of piezoelectric crystals 33 and positioning of tool clamp point 40 are modified as compared to prior horns. Note transducer 18 is shortened so that tool clamp point 40 is at the optimum position for imparting high frequency ultrasonic energy. For purposes of the following discussion on effective transducer length the reader is referred to FIGS. 6 and 7 of the above incorporated reference, TI-14570 and accompanying text.

As an example for the sake of comparison, a prior art transducer is effectively about 3.15 inches long, and is designed to transmit US energy at about 62.5 kHz so that 1.25 wavelengths are disposed along the effective length of the transducer.

The effective length of transducer 18 is about 2.98 inches. Transducer 18, in the preferred embodiment, is designed to transmit 114 kHz H.F. US energy so that 2.25 wavelengths are disposed along the effective length.

Thus, the effective length of transducer 18 is reduced compared to the effective length of the 62.5 kHz transducer. In this comparison, the reduction is about 52 mils. The specific reduction in length will depend on the H.F. US used and the design of the transducer, and these parameters will vary for different applications.

In preferred embodiments, heating element 19 is a 5 watt 28 volt unit as can be obtained from the Watlow Company of Yew York and is mounted to transducer 18 as shown in FIG. 2. Alternatively, heating element 19 could be mounted externally to transducer 18. Heating element 19 is supplied with electrical power via wires 44. Heating element 19 heats transducer 18 so as to conductively heat interface 32 via capillary 16.

Referring again to FIG. 1, high frequency ultrasonic source 20 is designed to provide an ac signal to piezoelectric crystals 33 in a range above about 100 kHz. The preferred frequency is about 114 kHz. Ultrasonic source 20 is conventionally connected to crystals 32.

Heater block 22 provides thermal energy to interface 32 via leadframe 15 and IC 14.

An additional thermal source (not shown) can be incorporated to provide additional thermal energy at the interface 32, if necessary to facilitate the bonding process. However, it should be noted that such a thermal source will normally not be required when apparatus 10 is used at temperatures below 200° C. Pressure source 24 is conventional in nature and provides pressure (mashing) to interface 32 via capillary 16.

The remainder of apparatus 10, symbolized by the box at reference numeral 26 includes control circuitry, mechanical armature, etc. In the preferred embodiment, bonding apparatus 10 is the Abacus III bonder incorporating some or all of the improvements of the present invention. The Abacus III bonder is manufactured by Texas Instruments of Dallas, Tex.

The process of the present invention will now be discussed. Generally speaking, an IC 14 having a bond site 28 is mounted on a leadframe 15 or the like, and then wire 12 is heated (when ball bonding is performed) for formation of ball 30 as is well known in the art. Bond end 30 is then contacted to bond site 28 so as to present an interface 32 where welding or bonding occurs.

When thermosonic bonding is utilized, as is the case in the present invention, heat is typically applied to interface 32 while capillary 16 positions and secures bond end 30 at bond site 28, while transducer 18 provides ultrasonic energy and pressure source 24 applies mashing force via capillary 16. All of the above bonding steps are typically controlled by control circuitry in bonder 26, as is well known in the art. For purposes of the present application, high frequency ultrasonic energy (H.F. US) means frequencies above about 100 kHz. Additionally, heating element 19 conductively applies thermal energy to interface 32 via capillary 16 and transducer 18. Capillary 16 is substantially made of beryllium oxide in the preferred embodiment for enhanced conductivity.

During the bonding process interface 32 is thermally heated by heater block 22 and heating element 19. It should be noted that a certain amount of ultrasonic energy delivered from ultrasonic energy source 20 is also converted to thermal energy at interface 32, but this is beyond the scope of discussion for the present invention in this context. The thermal energy supplied by ultrasonic energy 20 is of course a third thermodynamic component of the total thermal energy delivered to interface 32 but for purposes of this discussion we shall ignore this component and assume that all thermal energy not originating from heater block 22 originates from heating element 19.

Heater block 22 is of course indirectly heating interface 32 by thermal conductivity via leadframe 15, IC 14 and bond site 28. Likewise, heating element 19 is heating interface 32 by electrical conductivity from heating element 19 to transducer 18 where it is thermally conducted to capillary 16 and thus delivered to interface 32. Heater block 22 is maintained at a temperature below 200° C. (e.g. 165° C.). It follows then, that were no heat delivered from heating element 19, interface 32 would be at about 165° C. as well. Thus the amount of thermal energy delivered by heating element 19 is predetermined so as to sustain interface 32 at about 180° C. during the ball bonding process.

Since heater block 22 is maintained at a lesser temperature (e.g. below 200° C.), other materials with lower melting points can be used in the construction of IC 14 or leadframe 15. For example, leadframe 15 can be plated with tin or solder (melting points 165° C. and 185° C., respectively). Thus the use of heater block 22 at a lower temperature allows more flexibility in choosing fabrication materials and processing conditions. Another advantage of tin and solder is that they are relatively inexpensive compared to other materials used for plating leadframes.

It should be noted that gold wire 12 can be effectively bonded to bond site 28 at a bonding temperature of about 180° C. or thereabouts due to the enhanced bondability when utilizing high frequency ultrasonic energy (i.e. about 100 kHz and above). See TI-14570 and TI-15067, incorporated by reference hereinabove.

Although the invention has been described in detail herein with reference to its preferred embodiment and certain described alternatives, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that all such changes and additional embodiments are within the spirit and true scope of the invention as claimed below.

What is claimed is:

1. A method of forming a microelectronic bond, the method comprising the steps of:
   providing a conductive bond site;
   providing a wire having a bond end;
   contacting the bond end of the wire to the bond site, the bond end and the bond site presenting an interface therebetween;
   providing a heat source;
   providing between the heat source and the interface a thermally conductive path which includes a thermally conductive ultrasonic transducer; and
   applying thermal energy to the interface via the thermally conductive transducer, including the step of using the heat source to heat the transducer.

2. The method of claim 1 wherein the bond site is integrally formed with an integrated circuit, and a leadframe is affixed adjacent the integrated circuit, and thermal energy is also applied to the integrated circuit.

3. The method of claim 2 wherein the leadframe is plated with a conductive material, the wire and the conductive material presenting respective melting points, and the amount of thermal energy applied to the integrated circuit is predetermined so that the temperature of the integrated circuit is below the melting point of the conductive material, yet due to the thermal energy applied via the transducer, the temperature at the interface is above the melting point of the wire.

4. The method of claim 3 wherein the wire includes substantial amounts of a pure metal.

5. The method of claim 3 wherein the wire includes substantial amounts of an alloy.

6. The method of claim 3 wherein the temperature of the integrated circuit is about 165° C.

7. The method of claim 6 wherein the temperature at the interface is below about 200° C.

8. The method of claim 6 wherein the temperature at the interface is about 180° C.

9. The method of claim 7, including the step of operating the thermally conductive ultrasonic transducer at a frequency above about 100 kHz.

10. The method of claim 1, including the step of operating the thermally conductive ultrasonic transducer at a frequency above about 100 kHz.

11. An assembly comprising:
    a thermally conductive ultrasonic transducer; and
    a heating element disposed for contact with the thermally conductive ultrasonic transducer whereby sufficient thermal energy can be applied to the transducer to heat the transducer.

12. The assembly of claim 11, including a high frequency ultrasonic power source connected to said thermally conductive transducer for driving said thermally conductive transducer at a frequency above about 100 kHz.

13. The assembly of claim 12 wherein the transducer includes a tool clamping point thereon, and a bonding tool is fixed in the tool clamping point in thermal contact with the thermally conductive transducer.

14. The assembly of claim 13 wherein the bonding tool is a capillary.

15. The assembly of claim 14 wherein the capillary includes a substantial amount of beryllium oxide.

16. The assembly of claim 13, wherein said heating element and said thermally conductive transducer and said bonding tool define a thermal circuit in which said thermally conductive transducer is arranged in series between said heating element and said bonding tool.

17. The assembly of claim 16, including a high frequency ultrasonic power source connected to said thermally conductive transducer for driving said thermally conductive transducer at a frequency above about 100 kHz.

18. The assembly of claim 17, wherein said heating element is disposed within said thermally conductive transducer.

19. The assembly of claim 11, wherein said heating element is mounted on said thermally conductive transducer.

20. The assembly of claim 19, wherein said heating element is disposed within said thermally conductive transducer.

* * * * *